(12) United States Patent
Hwang et al.

(10) Patent No.: US 9,082,333 B2
(45) Date of Patent: Jul. 14, 2015

(54) INTEGRATED CIRCUIT CONFIGURED TO DETECT A SHORT CIRCUIT THEREIN AND APPARATUS HAVING THE SAME

(75) Inventors: Joo-Won Hwang, Suwon-si (KR); Jae Wook Kwon, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 481 days.

(21) Appl. No.: 13/236,943

(22) Filed: Sep. 20, 2011

(65) Prior Publication Data

US 2012/0086679 A1 Apr. 12, 2012

(30) Foreign Application Priority Data

Oct. 11, 2010 (KR) .................. 10-2010-0098575

(51) Int. Cl.
*G09G 3/00* (2006.01)
*G09G 3/20* (2006.01)
*G01R 31/28* (2006.01)

(52) U.S. Cl.
CPC ............ *G09G 3/006* (2013.01); *G09G 3/20* (2013.01); *G01R 31/2884* (2013.01); *G09G 2310/0267* (2013.01); *G09G 2310/0275* (2013.01); *G09G 2310/0278* (2013.01); *G09G 2330/12* (2013.01)

(58) Field of Classification Search
None
See application file for complete search history.

(56) References Cited

U.S. PATENT DOCUMENTS

| 7,456,647 | B2* | 11/2008 | Jeon et al. ................ 324/760.01 |
| 2003/0098859 | A1* | 5/2003 | Udo et al. .................... 345/204 |
| 2008/0179592 | A1* | 7/2008 | Na ................................ 257/48 |
| 2010/0213960 | A1* | 8/2010 | Mok et al. .................... 324/755 |

FOREIGN PATENT DOCUMENTS

| KR | 950013604 B1 | 11/1995 |
| KR | 10-2004-0063576 A | 7/2004 |
| KR | 10-2005-0118767 A | 12/2005 |

\* cited by examiner

*Primary Examiner* — David D Davis
(74) *Attorney, Agent, or Firm* — Lee & Morse, P.C.

(57) ABSTRACT

An integrated circuit is provided. The integrated circuit includes a plurality of output pads, a plurality of test pads, and a plurality of channel shift switches respectively connected between the plurality of output pads and the plurality of test pads and operated by a plurality of channel shift switch enable signals. A short path between the plurality of output pads may be detected when each of the plurality of channel shift switch enable signals are simultaneously at a high level.

10 Claims, 10 Drawing Sheets

INTEGRATED CIRCUIT CONFIGURED TO DETECT A SHORT CIRCUIT THEREIN AND APPARATUS HAVING THE SAME

CROSS-REFERENCE TO RELATED APPLICATION

This application claims priority from Korean Patent Application No 10-2010-0098575, filed on Oct. 11, 2010, in the Korean Intellectual Property Office, and entitled: "Integrated Circuit, Test Operation Method Thereof, and Apparatus Having the Same," and all the benefits accruing therefrom under 35 U.S.C. 119, the contents of which is incorporated by reference herein in its entirety.

BACKGROUND

1. Field

Embodiments relate to a test operation method of an integrated circuit (IC), and more particularly, to an IC for detecting a short path, a test operation method thereof, and devices having the same.

2. Description of the Related Art

Due to error in a manufacturing process, a plurality of poly-silicon particles may be included between a plurality of input/output pads in an IC. As a result of the plurality of poly-silicon particle, a short path may occur between the plurality of input/output pads of the IC. A test operation method for detecting a short path in the ICs is required.

SUMMARY

One or more embodiments may provide an integrated circuit configured to detect a short path, which may be formed in each of a plurality of integrated circuits, at the same time, a test operation method thereof, and devices including such an integrated circuit.

One or more embodiments may provide an integrated circuit. The integrated circuit includes a plurality of output pads, a plurality of test pads, a plurality of channel shift switches respectively connected between the plurality of output pads and the plurality of test pads and operated by a plurality of channel shift switch enable signals. Existence of a short path between the plurality of output pads is determined when each of the plurality of channel shift switch enable signals are simultaneously at a high level.

The integrated circuit may include a plurality of even numbered test pad control switches connecting corresponding even numbered test pads among the plurality of test pads, and a plurality of odd numbered test pad control switches connecting corresponding odd numbered test pads among the plurality of test pads.

The integrated circuit may include a channel shift switch enable signal generation block configured to generate the plurality of channel shift switch enable signals according to a short path enable signal.

When the short path enable signal is at a high level, the channel shift switch enable signal generation block may generate the plurality of channel shift switch enable signals having a high level.

The channel shift switch enable signal generation block may include a plurality of NOR gates for performing a NOR operation on the short path enable signal and a corresponding one of a plurality of channel shift switch control signals, and a plurality of inverters for outputting the plurality of channel shift switch enable signals by inverting a signal output from the plurality of NOR gates, respectively.

The integrated circuit may include a plurality of charge share switches respectively connected between each of the plurality of output pads and a power supply line, and a plurality of output switches respectively connected to each of the plurality of output pads.

Each of a plurality of charge share switches may be in an off-state in response to a charge share switch enable signal to detect a short path between the plurality of output pads, wherein each of the plurality of output switches is in an off-state in response to an output switch enable signal.

Even numbered test pads and odd numbered test pads among the plurality of test pads may provided with different voltages to detect a short path between the plurality of output pads.

One or more embodiments may provide a display driver. The display driver includes a source driver having an integrated circuit configured to supply an image data to a display panel in response to a plurality of source driver control signals, a gate driver configured to successively drive gate lines of the display panel in response to a plurality of gate driver control signals, and a controller configured to generate the plurality of source driver control signals and the plurality of gate driver control signals. The integrated circuit includes a plurality of output pads, a plurality of test pads, and a plurality of channel shift switches respectively connected between the plurality of output pads and the plurality of test pads and operated by a plurality of channel shift switch enable signals. Existence of a short path between the plurality of output pads is determined when each of the plurality of channel shift switch enable signals are simultaneously at a high level.

The integrated circuit further may include a plurality of even numbered test pad control switches connecting corresponding even numbered test pads among the plurality of test pads, and a plurality of odd numbered test pad control switches connecting corresponding odd numbered test pads among the plurality of test pads.

The integrated circuit may include a channel shift switch enable signal generation block configured to generate the plurality of channel shift switch enable signals according to a short path enable signal.

When the short path enable signal is at a high level, the channel shift switch enable signal generation block may generate the plurality of channel shift switch enable signals having a high level.

The channel shift switch enable signal generation block may include a plurality of NOR gates performing a NOR operation on a short path enable signal and a corresponding one of a plurality of channel shift switch control signals, and a plurality of inverters inverting signal outputs from each of the plurality of NOR gates and outputting the plurality of channel shift switch enable signals, respectively.

Even numbered test pads and odd numbered test pads among the plurality of test pads may be provided with different voltages to detect a short path between the plurality of output pads.

One or more embodiments may provide a display device. The display, device includes a display panel and a display driver. The display driver includes a source driver including an integrated circuit configured to supply an image data to a display panel in response to a plurality of source driver control signals, a gate driver configured to successively drive gate lines of the display panel in response to a plurality of gate driver control signals, and a controller configured to generate the plurality of source driver control signals and the plurality of gate driver control signals. The integrated circuit includes a plurality of output pads, a plurality of test pads, and a plurality of channel shift switches respectively connected between the plurality of output pads and the plurality of test pads and operated by a plurality of channel shift switch enable signals. Existence of a short path between the plurality of output pads is determined when each of the plurality of channel shift switch enable signals are simultaneously at a high level.

One or more embodiments may provide a method of testing an integrated circuit including a plurality of output pads and a plurality of test pads. The method includes supplying a plurality of channel shift switch enable signals that are simultaneously at a high level to a plurality of channel shift switches respectively connected between the plurality of output pads and the plurality of test pads, supplying different voltages to the plurality of test pads, and determining whether one or more short paths exists between the plurality of output pads.

Determining whether one or more short paths exists may occur while the plurality of channel shift switch enable signals are simultaneously at the high level.

The method may include generating the channel shift switch enable signals according to a short path enable signal.

Supplying different voltages to the plurality of test pads may include supplying even numbered test pads and odd numbered test pads among the plurality of test pads with different voltages.

BRIEF DESCRIPTION OF THE DRAWINGS

Features will become more apparent to those of ordinary skill in the art by describing in detail exemplary embodiments with reference to the attached drawings, in which.

DETAILED DESCRIPTION

Figure 1:
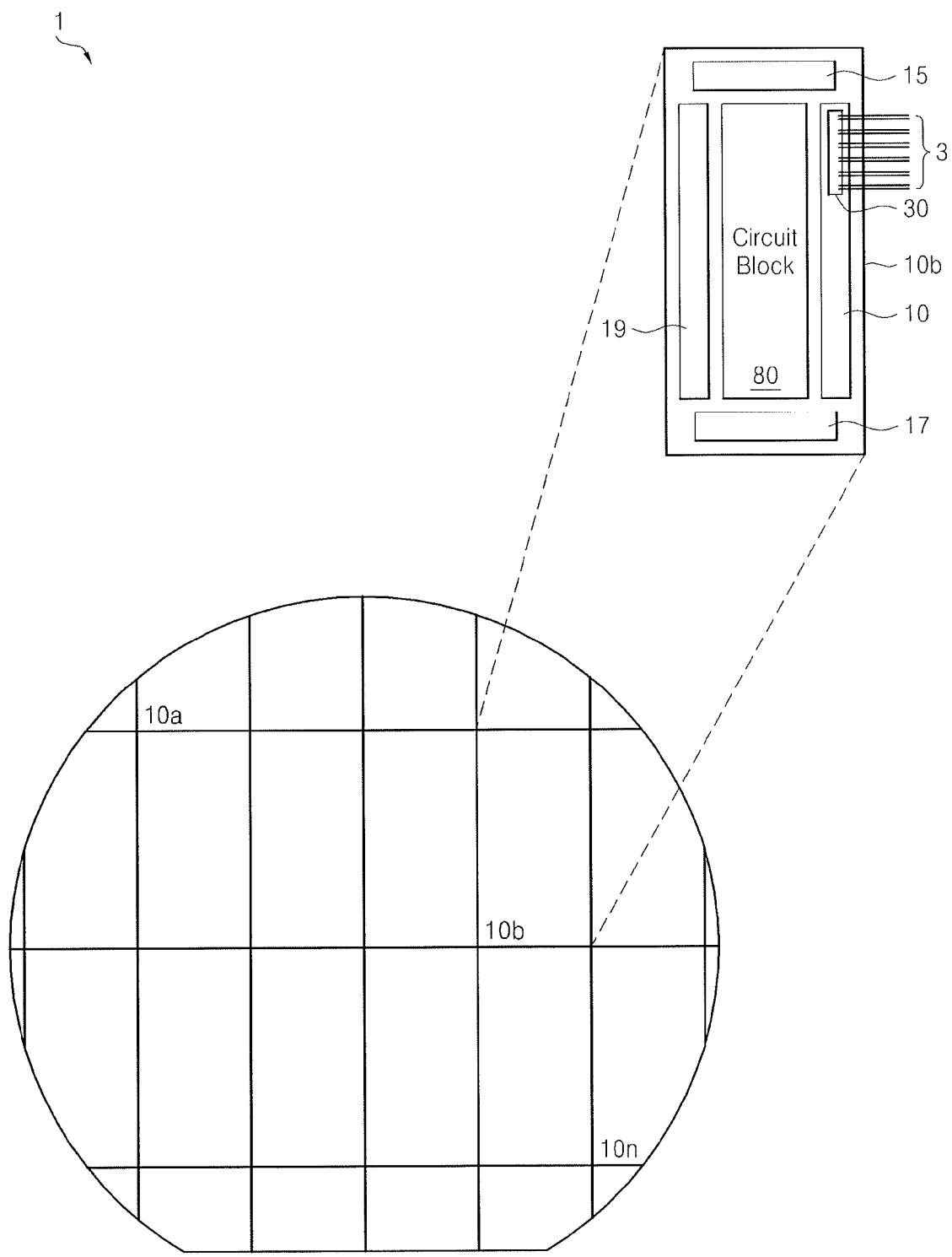
FIG. 1 illustrates a wafer including a plurality of integrated circuit dies according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of regions may be exaggerated for clarity of illustration. It will also be understood when an element is referred to as being "between" two elements, it can be the only element between the two elements, or one or more intervening elements may also be present. Like reference numerals refer to like elements throughout.

FIG. 1 illustrates a wafer 1 including a plurality of integrated circuit dies 10a, 10b, . . . 10n according to an exemplary embodiment. Referring to FIG. 1, the wafer 1 includes a plurality of integrated circuit dies 10a, 10b, . . . and 10n.

Each of the plurality of integrated circuit dies 10a, 10b, . . . and 10n may include a plurality of input/output pad blocks and a circuit block for performing a signal process function. Referring to FIG. 1, e.g., the integrated circuit die 10b includes a plurality of output pad blocks 10, 15 and 17, an input pad block 19, and a circuit block 80. The circuit block 80 may perform signal processing functions, e.g., a write operation and/or a read operation.

In one or more embodiments, a layout of the blocks 10, 15, 17, 19 and 80 of the integrated circuit 10b may be changed. In FIG. 1, the integrated circuit 10b is illustrated in more detail as an example of the integrated circuit dies 10a, 10b, . . . and 10n.

A tester (not shown) may include a plurality of probe pins 3 and may detect each short path of a plurality of integrated circuit dies 10a, 10b, . . . and 10n using the probe pins 3.

Figure 2:
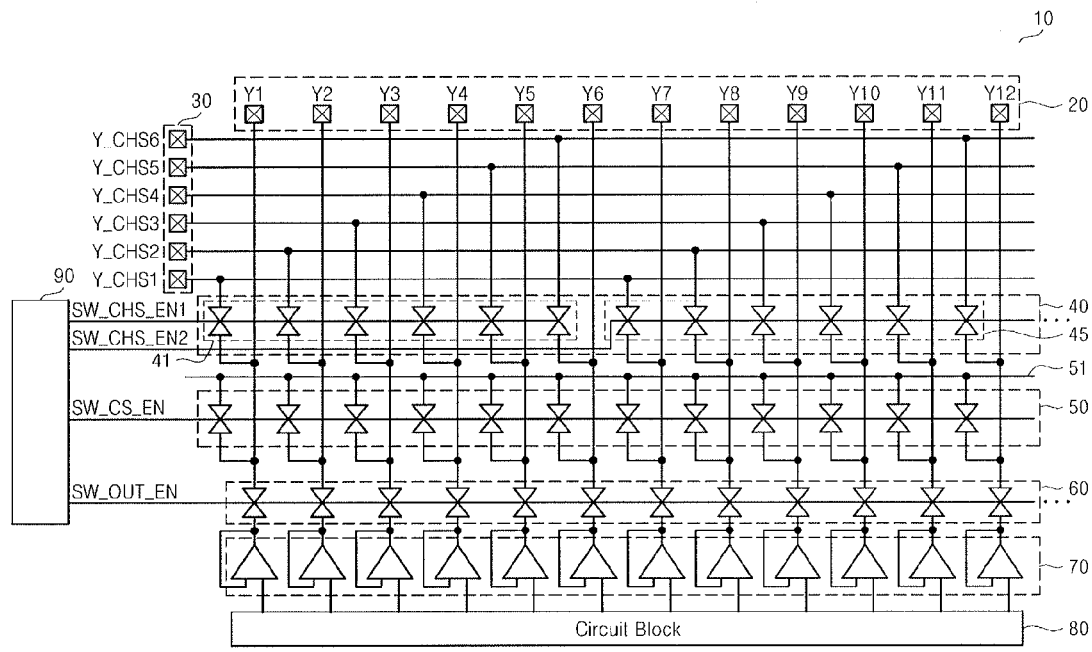
FIG. 2 illustrates a circuit diagram of an exemplary embodiment of an output pad block of the integrated circuit illustrated in FIG. 1.

FIG. 2 illustrates a circuit diagram of an exemplary embodiment of an output pad block of the integrated circuit illustrated in FIG. 1. In the exemplary embodiment and for convenience of explanation, in FIG. 2, the number of channel shift switch enable signals is 2. Embodiments are not limited thereto, i.e., the number of the plurality of channel shift switch enable signals may be changed variously.

Referring to FIGS. 1 and 2, the output pad block 10 of the integrated circuit 10b may include a plurality of output pads Y1~Y12 (20), a plurality of test pads Y_CHS1~Y_CHS6 (30) and a plurality of channel shift switches 40. Each of the plurality of channel shift switches 40 may be connected between respective ones of the plurality of output pads Y1~Y12 (20) and the plurality of test pads Y_CHS1~Y_CHS6 (30). In one or more embodiments, e.g., the number of the plurality of output pads Y1~Y12 (20) and the number of the plurality of test pads Y_CHS1~Y_CHS6 (30) may be changed, i.e., are not limited to that illustrated in FIGS. 1 and 2.

Each of the plurality of channel shift switches 40 may be operated by a plurality of channel shift switch enable signals SW_CHS_EN1 and SW_CHS_EN2. For example, first channel shift switches 41 may be operated by a first channel shift switch enable signal SW_CHS_EN1, and second channel shift switches 45 may be operated by a second channel shift switch enable signal SW_CHS_EN2.

Each of a plurality of channel shift switch enable signals SW_CHS_EN1 and SW_CHS_EN2 may have a high level simultaneously to detect a short path between respective one of the plurality of output pads 20. A short path corresponds to an unintentionally formed current path formed between the plurality of output pads 20 by, e.g., a plurality of poly-silicon particles.

The output pad block 10 of the integrated circuit 10b may further include a plurality of charge share switches 50, a plurality of output switches 60, a plurality of amplifiers 70, and the circuit block 80. The plurality of charge share switches 50 may be switched for charge sharing. The charge share switches 50 of the integrated circuit 10b may improve a setting time of a signal output from the circuit block 80 and may reduce power consumption.

Each of the plurality of charge share switches 50 may be connected between a respective one of the plurality of output pads Y1~Y12 (20) and a power supply line 51. The power supply line 51 may supply a power voltage to the plurality of output pads Y1~Y12 (20) in response to a charge share switch enable signal SW_CS_EN during a charge share operation. Accordingly, the plurality of output pads Y1~Y12 (20) may share a charge by the power voltage.

The plurality of output switches 60 may supply voltages of the plurality of amplifiers 70 to the plurality of output pads Y1~Y12 (20), respectively, in response to an output switch enable signal SW_OUT_EN. The plurality of channel shift switches 40, the plurality of charge share switches 50, and/or the plurality of output switches 60 may be embodied as a transmission gate, respectively.

The output pad block 10 of the integrated circuit 10b may further include an enable signal generator 90. In one or more embodiments, the enable signal generator 90 may be embodied in another block of the integrated circuit 10b, e.g., the input pad block 19 or the circuit block 80. The plurality of enable signals, e.g., a plurality of channel shift switch enable signals SW_CHS_EN1 and SW_CHS_EN2, the share switch enable signal SW_CH_EN, and the output switch enable signal SW_OUT_EN may be generated by the enable signal generator 90.

Figure 3:
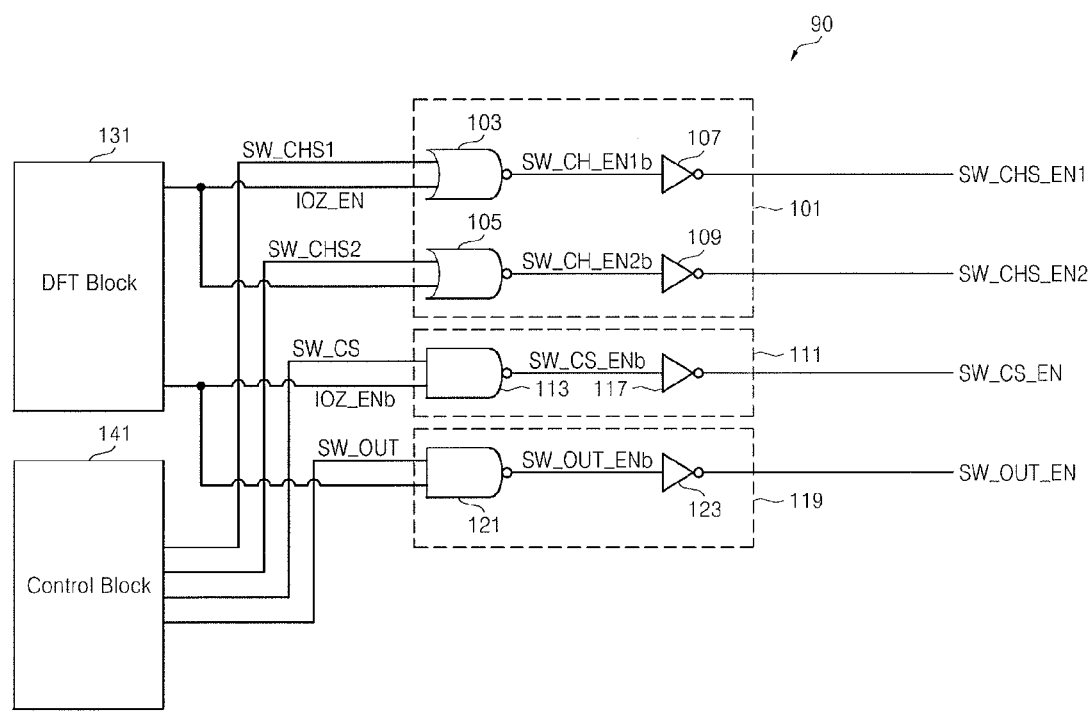
FIG. 3 illustrates a block diagram of an exemplary embodiment of the enable signal generator illustrated in FIG. 2.

FIG. 3 illustrates a block diagram of an exemplary embodiment of the enable signal generator 90 illustrated in FIG. 2. Referring to FIGS. 1 to 3, the enable signal generator 90 may include a channel shift switch enable signal generation block 101, a charge share switch enable signal generation block 111, and an output switch enable signal generation block 119.

The channel shift switch enable signal generation block 101 may generate a plurality of channel shift switch enable signals SW_CHS_EN1 and SW_CHS_EN2 according to a short path enable signal IOZ_EN.

The channel shift switch enable signal generation block 101 may include a plurality of NOR gates 103 and 105, and a plurality of inverters 107 and 109. The first NOR gate 103 performs a NOR operation on a short path enable signal IOZ_EN and a first channel shift switch control signal SW_CHS1. The second NOR gate 105 performs a NOR operation on the short path enable signal IOZ_EN and a second channel shift switch control signal SW_CHS2. In one or more embodiments, each of the plurality of channel shift switch control signals SW_CHS1 and SW_CHS2 may have different or same levels.

The first inverter 107 inverts a signal SW_CH_EN1b output from the first NOR gate 103 and outputs a first channel shift switch enable signal SW_CHS_EN1. The second inverter 109 inverts a signal SW_CH_EN2b output from the second NOR gate 105 and outputs a second channel shift switch enable signal SW_CHS_EN2.

The channel shift switch enable signal generation block 101 may generate a plurality of channel shift switch enable signals SW_CHS_EN1 and SW_CHS_EN2 having a high level regardless of a level of a channel shift switch control signal SW_CHS1 or SW_CHS2 when a short path enable signal IOZ_EN is in a high level.

The charge share switch enable signal generation block 111 may generate a charge share switch enable signal SW_CS_EN according to an inverted short path enable signal IOZ_ENb. The charge share switch enable signal generation block 111 may include a first NAND gate 113, and a third inverter 117.

The first NAND gate 113 performs a NAND operation on the inverted short path enable signal IOZ_ENb and a charge share switch control signal SW_CS. The third inverter 117 inverts a signal SW_CS_ENb output from the first NAND gate 113 and outputs a charge share switch enable signal SW_CS_EN.

The charge share switch enable signal generation block 111 may generate a charge share switch enable signal SW_CS_EN having a low level regardless of a level of the charge share switch control signal SW_CS when the inverted short path enable signal IOZ_ENb is in a low level.

The output switch enable signal generation block 119 may generate an output switch enable signal SW_OUT_EN according to the inverted short path enable signal IOZ_ENb. The output switch enable signal generation block 119 may include a second NAND gate 121 and a fourth inverter 123. The second NAND gate 121 performs a NAND operation on the inverted short path enable signal IOZ_ENb and an output switch control signal SW_OUT. The fourth inverter 123 inverts a signal SW_OUT_ENb output from the second NAND gate 121 and outputs an output switch enable signal SW_OUT_EN.

The output switch enable signal generation block 119 may generate an output switch enable signal SW_OUT_EN having a low level regardless of a level of an output switch control signal SW_OUT when the inverted short path enable signal IOZ_ENb is in a low level. The short path enable signal IOZ_EN and the inverted short path enable signal IOZ_ENb may be generated by a test block (for example, design for testability (DFT) block 131).

The plurality of channel shift switch control signals SW_CHS1 and SW_CHS2, the charge share switch control signal SW_CS, and the output switch control signal SW_OUT may be generated by a control block 141.

Referring to FIG. 2, each of the plurality of amplifiers 70 may amplify and output each of a plurality of output signals output from the circuit block 80 the plurality of output switches 60, respectively.

The circuit block 80 may include a plurality of circuits (not shown) for performing a main function of the integrated circuit 10b, e.g., a write operation or a read operation. For example, the circuit block 80 may include the plurality of circuits for performing a function of a source driver (not shown). The tester may detect a short path by using the output pads 20, and may test a plurality of integrated circuit dies 10a, 10b, ... and 10n at the same time.

Figure 4:
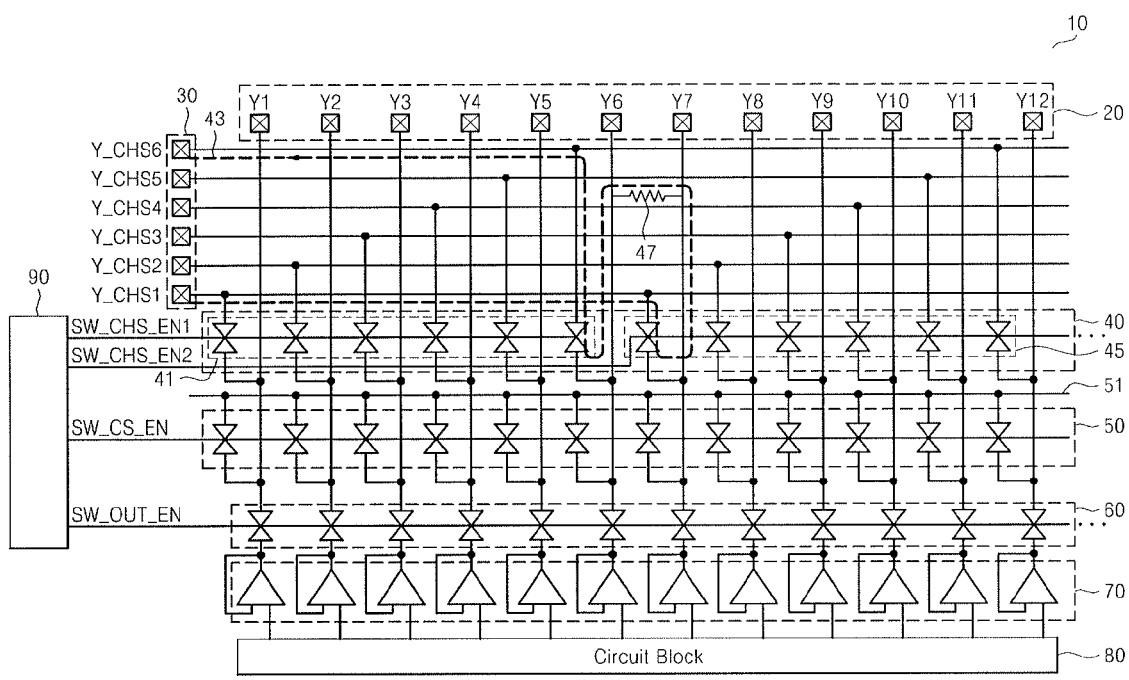
FIG. 4 circuit diagram of the integrated circuit of FIG. 1 including an exemplary short path.

FIG. 4 illustrates a circuit diagram of the integrated circuit of FIG. 1 including an exemplary short path. Referring to FIGS. 1 to 4, a plurality of poly-silicon particles 47 may be included between two or more of the output pads 20 of the integrated circuit 10b by various reasons during a manufacturing process. For example, a short path 43 may be undesirably formed inside the integrated circuit 10b as a result of such poly-silicon particles 47.

When one or more short paths, e.g., 43, are formed, the tester may detect a current or a voltage between corresponding ones of the test pads 30. More particularly, e.g., when the short path 43 is formed between a sixth output pad Y6 and a seventh output pad Y7 among the plurality of output pads 20 of the integrated circuit 10b, the tester may detect a current or a voltage between a first test pad Y_CHS1 and a sixth test pad Y_CHS6 among the plurality of test pads 30.

More particularly, when a first channel shift switch enable signal SW_CHS_EN1 and a second channel shift switch enable signal SW_CHS_EN2 are at a high level at the same time, the tester may detect the short path 43 formed between the sixth output pad Y6 and the seventh output pad Y7.

Figure 5:
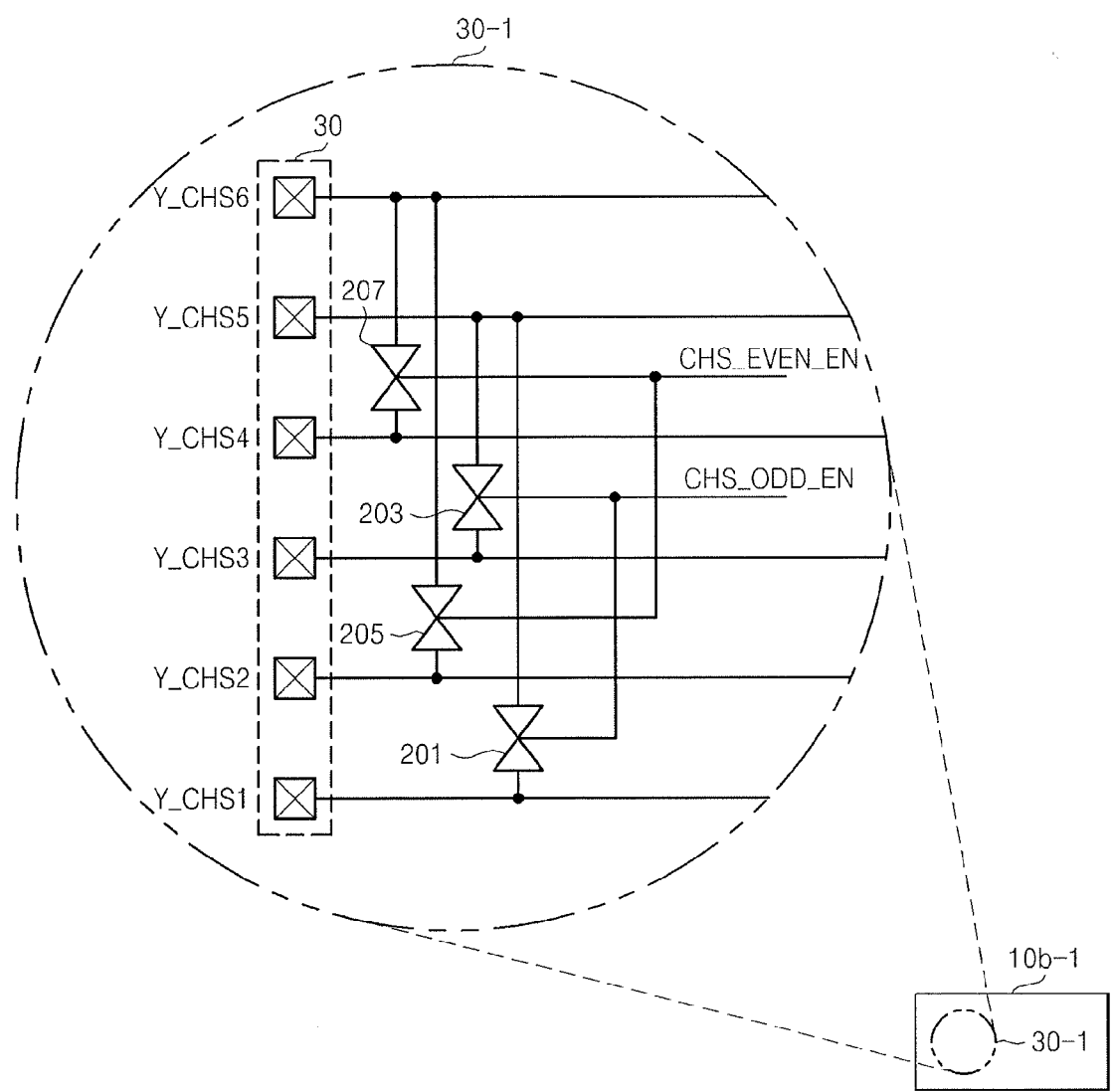
FIG. 5 illustrates a circuit diagram of another exemplary embodiment of an output pad block of the integrated circuit illustrated in FIG. 1.

FIG. 5 illustrates a circuit diagram of another exemplary embodiment of an output pad block of the integrated circuit illustrated in FIG. 1. In the exemplary embodiment of FIG. 5, six test pads 30 are illustrated. Embodiments are not, however, limited thereto and a number of the plurality of test pads 30 may be greater than or less than 6.

In general, only differences between the exemplary integrated circuit 10b-1 of FIG. 5 and the exemplary integrated circuit 10b of FIG. 1 will be described below. More particularly, the integrated circuit 10b-1 of FIG. 5 substantially corresponds to the integrated circuit 10b of FIG. 1, but includes a region 30-1 including a plurality of test pads Y_CHS1~Y_CHS6 (30). Features described above will not be repeated.

Referring to FIG. 5, the region 30-1 may include the plurality of test pads Y_CHS1~Y_CHS6 (30), a plurality of odd numbered test pad control switches 201 and 203, and a plurality of even numbered test pad control switches 205 and 207.

Each of the plurality of odd numbered test pad control switches 201 and 203 may be respectively connected between odd numbered test pads Y_CHS1, Y_CHS3 and Y_CHS5 among the plurality of test pads Y_CHS1~Y_CHS6. For example, the test pad control switch 201 is connected between test pads Y_CHS1 and Y_CHS5, and the test pad control switch 203 is connected between test pads Y_CHS3 and Y_CHS5.

Each of a plurality of even numbered test pad control switches 205 and 207 is connected between even numbered test pads Y_CHS2, Y_CHS4 and Y_CHS6 among the plurality of test pads Y_CHS1~Y_CHS6. For example, the test pad control switch 205 is connected between test pads Y_CHS2 and Y_CHS6, and the test pad control switch 207 is connected between test pads Y_CHS4 and Y_CHS6.

Each of the plurality of odd numbered test pad control switches 201 and 203 may be operated by an odd numbered test pad enable signal CHS_ODD_EN. Each of the plurality of even numbered test pad control switches 205 and 207 is operated by an even numbered test pad enable signal CHS_EVEN_EN.

Since the integrated circuit 10b-1 includes the plurality of odd numbered test pad control switches 201 and 203, and the plurality of even numbered test pad control switches 205 and 207, it may control a plurality of test pads Y_CHS1~Y_CHS6 (30) using the odd numbered test pad enable signal CHS_ODD_EN and the even numbered test pad enable signal CHS_EVEN_EN.

For example, the integrated circuit 10b-1 may supply a first voltage, e.g., 10V, to a fifth test pad Y_CHS5 and a second voltage, e.g., 0V, to a sixth test pad Y_CHS6. Accordingly, the integrated circuit 10b-1 may test whether there is a short path in each of a plurality of output pads 20 without supplying an additional voltage to the rest of the test pads Y_CHS1~Y_CHS4.

The odd numbered test pad enable signal CHS_ODD_EN and the even numbered test pad enable signal CHS_EVEN_EN may be generated by the enable signal generator 90 illustrated in FIG. 3.

Figure 6:
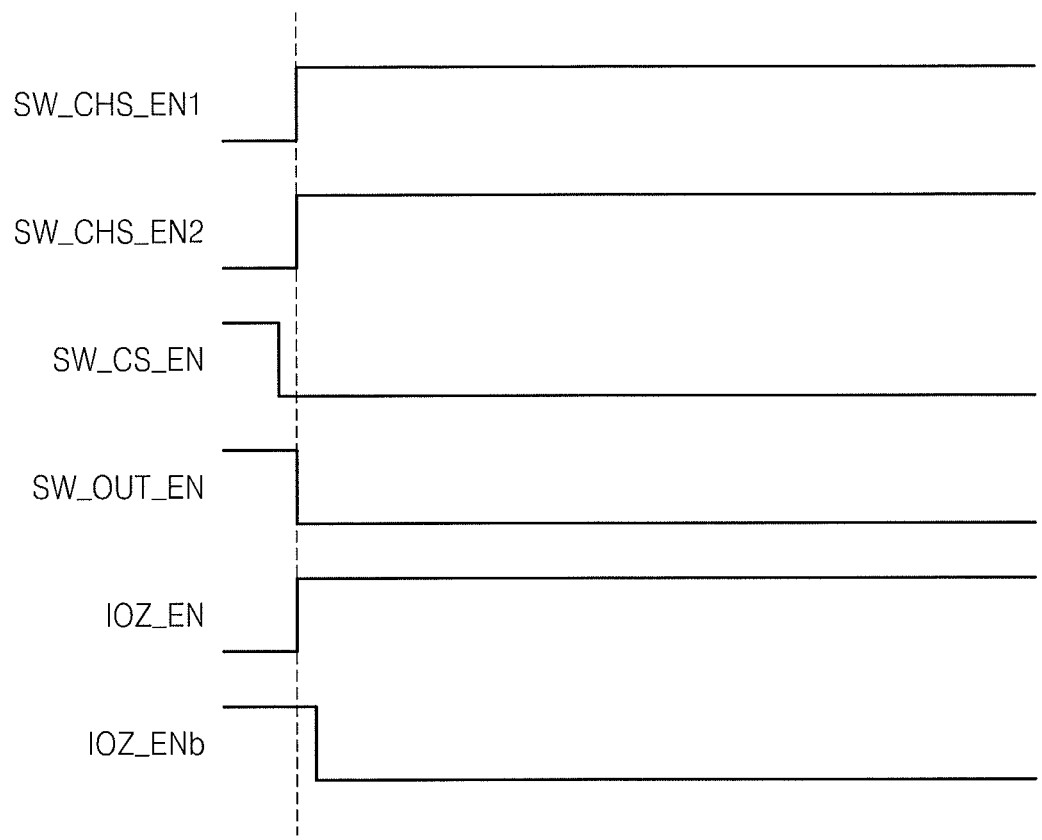
FIG. 6 illustrates a timing diagram of exemplary signals employable with the enable signal generator illustrated in FIG. 3.

FIG. 6 illustrates a timing diagram of exemplary signals employable with the enable signal generator illustrated in FIG. 3. Referring to FIGS. 1 to 6, the channel shift switch enable signal generation block 101 generates a plurality of channel shift switch enable signal SW_CHS_EN1 and SW_CHS_EN2 having a high level regardless of a level of a channel shift switch control signal SW_CHS1 or SW_CHS2 when the short path enable signal IOZ_EN is in a high level.

The test block, for example, design for testability (DFT) block 131 generates a short path enable signal IOZ_EN and an inverted short path enable signal IOZ_ENb. The charge share switch enable signal generation block 111 generates a charge share switch enable signal SW_CS_EN having a low level regardless of a level of a charge share switch control signal SW_CS when the inverted short path enable signal IOZ_ENb is at a low level.

The output switch enable signal generation block 119 generates an output switch enable signal SW_OUT_EN having a low level regardless of a level of an output switch control signal SW_OUT when the inverted short path enable signal IOZ_ENb is at a low level.

Accordingly, since the plurality of channel shift switch enable signals SW_CHS_EN1 and SW_CHS_EN2 have a high level at the same time, the tester may detect the short path 43 formed between the sixth output path Y6 and the seventh output path Y7.

Figure 7:
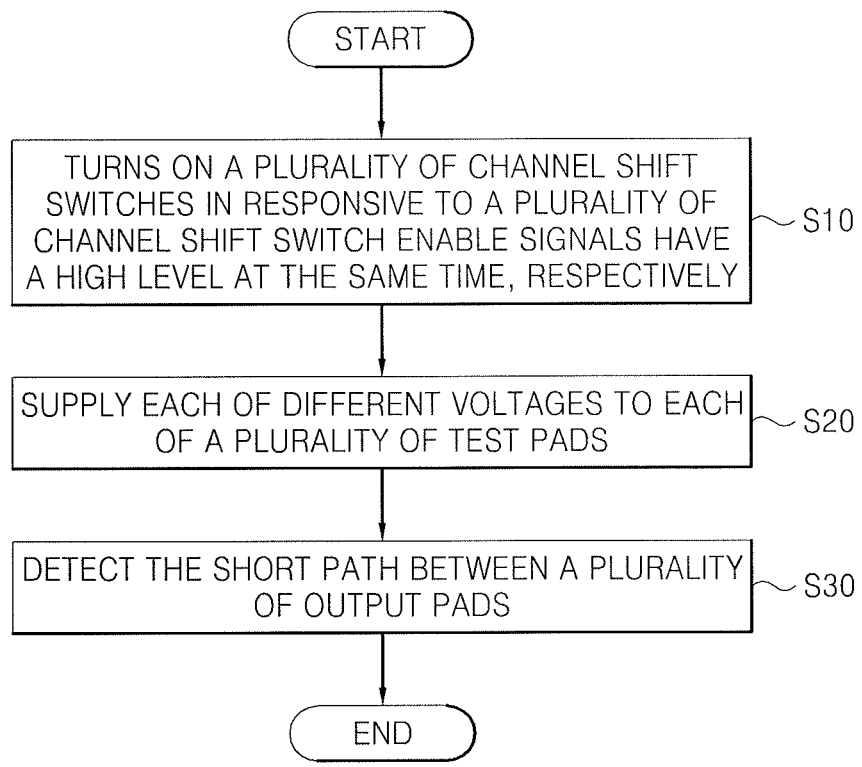
FIG. 7 illustrates a flowchart of an exemplary embodiment of a test operation method of an integrated circuit.

FIG. 7 illustrates a flowchart of an exemplary embodiment of a test operation method of the integrated circuit. Referring to FIGS. 1 to 7, the control signal generation block 90 generates a plurality of channel shift switch enable signals SW_CHS_EN1 and SW_CHS_EN2 and turns on a plurality of channel shift switches (S10). In one or more embodiments, the plurality of channel shift switch enable signals SW_CHS_EN1 and SW_CHS_EN2 may have a high level at the same time.

The plurality of probe pins 3 of the tester may supply different voltages to each of a plurality of test pads 30 (S20). For example, the tester supplies a first voltage, e.g., 10V, to odd numbered test pads Y_CHS1, Y_CHS3 and Y_CHS5 and supplies a third voltage, e.g., 0.5V, to even numbered test pads Y_CHS2, Y_CHS4 and Y_CHS6.

When the short path 43 is formed between the plurality of output pads 20, the plurality of probe pins 3 of the tester may detect the short path 43 (S30).

The plurality of probe pins 3 of the tester may supply different voltages to each of the plurality of test pads 30. Accordingly, the tester may test a plurality of integrated circuit dies 10a, 10b, ... and 10n at the same time. In addition, the control signal generation block 90 may generate the plurality of channel shift switch enable signals SW_CHS_EN1 and SW_CHS_EN2 having a high level at the same time, so that the tester may detect the short path 43 formed between output pads, e.g., the sixth output pad Y6 and the seventh output pad Y7.

Figure 8:
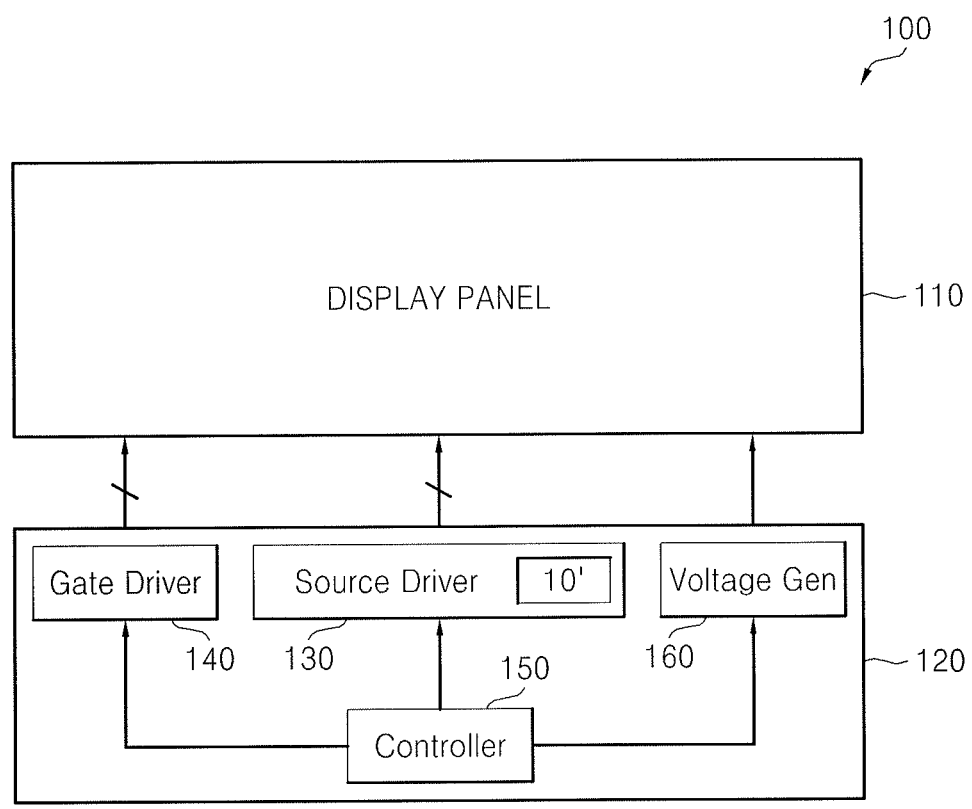
FIG. 8 illustrates a block diagram of an exemplary embodiment of a display device including an integrated circuit.

FIG. 8 illustrates a block diagram of an exemplary embodiment of a display device 100 including an integrated circuit. The display device 100 includes a display panel 110 and a display driver 120.

The display panel 110 may include a plurality of gate lines, a plurality of data lines, and a plurality of pixels formed between the gate lines and the data lines, respectively. The display driver 120 may include a source driver 130, a gate driver 140, a controller 150 and a voltage generator 160. The display driver 120 may be produced and packaged in a chip.

The source driver 130 may supply an image data to the display panel 110 in response to a source control signal output from the controller 150. The source driver 130 includes the integrated circuit 10'. The integrated circuit 10' may correspond to the integrated circuit 10b illustrated in FIGS. 1 to 4 or the integrated circuit 10b-1 illustrated in FIG. 5.

The gate driver 140 may successively drive a plurality of gate lines embodied in the display panel 110 in response to a gate control signal output from the controller 150. The voltage generator 160 may generate a voltage in response to a voltage control signal output from the controller 150 and may supply a generated voltage to the display panel 110. In one or more embodiments, the gate driver 140 or the controller 150 may include the circuit block 80 of FIG. 2.

Figure 9:
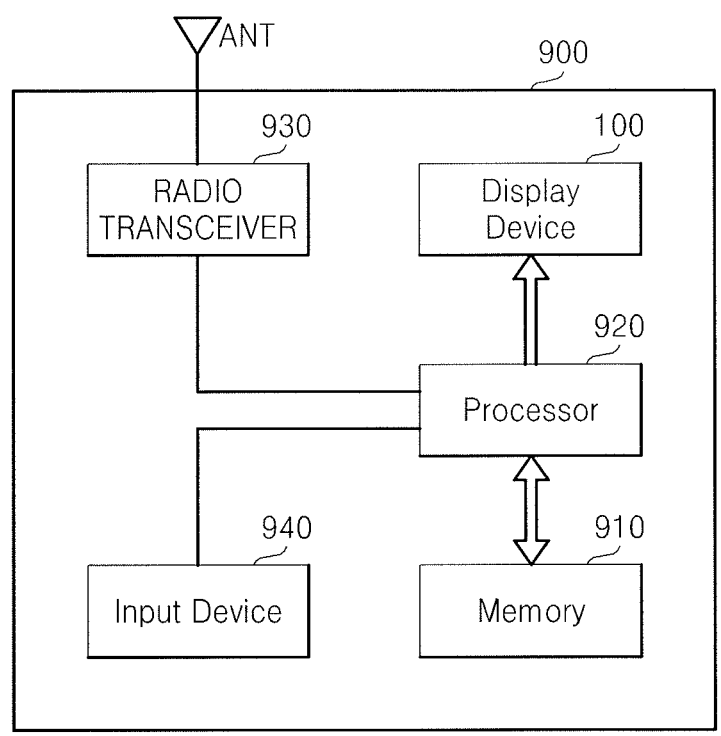
FIG. 9 illustrates an exemplary embodiment of an electronic device including the display device illustrated in FIG. 8.

FIG. 9 illustrates an exemplary embodiment of an electronic device 900 including the display device illustrated in FIG. 8. Referring to FIG. 9, the electronic device 900 may be embodied, e.g., as a cellular phone, a smart phone, tablet personal computer, personal digital assistant (PDA), portable multimedia player (PMP), laptop computer, a wireless communication device like an internet device, etc. The electronic device 900 may include a display device 100, a memory 910, a processor 920, a wireless transceiver 930 and an input device 940. The processor 920 may control an operation of a display device 100. The display device 100 may include the integrated circuit 10' illustrated in FIG. 8.

Data stored in the memory 910 may be displayed through the display device 100 under a control of the processor 920.

The wireless transceiver 930 may receive or transmit a wireless signal through an antenna ANT. For example, the wireless transceiver 930 may change a wireless signal received through the antenna ANT to a signal which the processor 920 may process. Accordingly, the processor 920 may process a signal output from the wireless transceiver 930, store a processed signal in the memory 910 or display it through the display device 100. Additionally, the wireless transceiver 930 may convert a signal output from the processor 920 into a wireless signal and output a converted wireless signal to outside through the antenna ANT.

The input device 940 is a device inputting control signals for controlling an operation of the processor 920 or data to be processed by the processor 920. For example, it may be embodied in a pointing device such as a touch pad and a computer mouse, a keypad or a keyboard.

The processor 920 may control an operation of the display device 100 so that data output from the memory 910, a wireless signal output from the wireless transceiver 930 or data output from the input device 940 may be displayed through the display device 100. The electronic device 900 may further include a memory controller (not shown) controlling an operation of the memory 910 under a control of the processor 920. In one or more embodiments, the memory controller may be embodied as a part of the processor 920 or separately.

Figure 10:
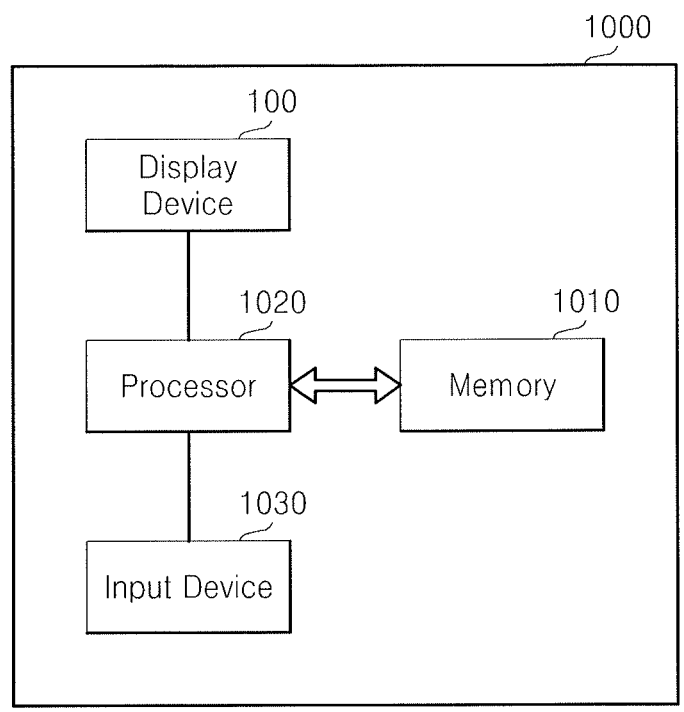
FIG. 10 illustrates another exemplary embodiment of an electronic device including the display device illustrated in FIG. 8.

FIG. 10 illustrates another example embodiment of an electronic device 1000 including the display device illustrated in FIG. 8. Referring to FIG. 10, the electronic device 1000 may be embodied as a data processing device such as a personal computer (PC), a tablet PC, a net-book, an e-reader, a personal digital assistant (PDA), a portable multimedia player (PMP), a MP3 player, a MP4 player, etc. The electronic device 1000 may include the display device 100, a memory 1010, a processor 1020, and an input device 1030.

The processor 1020 may control an operation of the display device 100. The display device 100 may include the integrated circuit 10' illustrated in FIG. 8. The integrated circuit 10' may correspond to the integrated circuit 10b illustrated in FIG. 1 to 4 or the integrated circuit 10b-1 illustrated in FIG. 5.

The processor 1020 may display data stored in the memory 1010 through the display device 100 according to an input signal generated by an input device 1030. For example, the input device 1030 may be embodied in a pointing device such as a touch pad or a computer mouse, a keypad or a keyboard. The electronic device 1000 may further include a memory controller (not shown) controlling an operation of the memory 1010 under a control of the processor 1020. In one or more embodiments, the memory controller may be embodied as a part of the processor 1020 or a separate.

Figure 11:
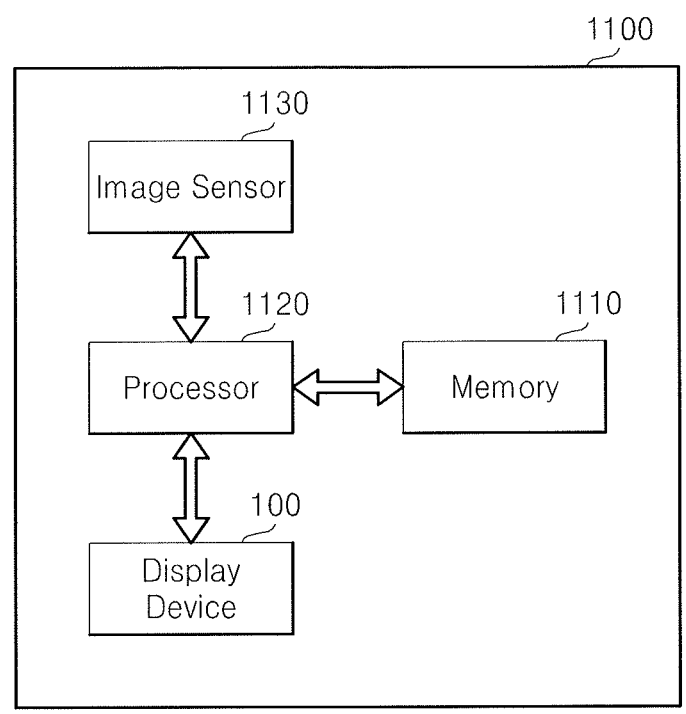
FIG. 11 illustrates another exemplary embodiment of an electronic device including the display device illustrated in FIG. 8.

FIG. 11 illustrates another example embodiment of an electronic device 1100 including the display device illustrated in FIG. 8. Referring to FIG. 11, the electronic device 1100 may include the display device 100, a memory 1110, a processor 1120 and an image sensor 1130.

The processor 1120 may control an operation of the display device 100. The display device 100 may include the integrated circuit of FIG. 8. The integrated circuit 10' may correspond to the integrated circuit 10b of FIG. 4 or the integrated circuit 10b-1 of FIG. 5.

The image sensor 1130 may convert an optical image to a digital signal, and a converted digital signal is stored in the memory 1110 or displayed through the display device 100 under a control of the processor 1120. Additionally, the digital signal stored in the memory 1110 may be displayed through the display device 100 under a control of the processor 1120.

The electronic device 1100 may further include a memory controller (not shown) controlling an operation of the memory 1100 under a control of the processor 1120. In one or more embodiments, the memory controller may be embodied as a part of the processor 1120 or separately.

One or more embodiments of an integrated circuit including a plurality of additional test pads may be configured to detect at least one short path which may be formed in each of a plurality of integrated circuits at the same time.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. An integrated circuit, comprising:
   a plurality of output pads;
   a plurality of test pads;
   a plurality of channel shift switches respectively connected between the plurality of output pads and the plurality of test pads and operated by a plurality of channel shift switch enable signals; and
   a channel shift switch enable signal generation block configured to generate the plurality of channel shift switch enable signals according to a short path enable signal, wherein existence of a short path between the plurality of output pads is determined when each of the plurality of channel shift switch enable signals are simultaneously at a high level, and
   wherein the channel shift switch enable signal generation block includes:
   a plurality of NOR gates for performing a NOR operation on the short path enable signal and a corresponding one of a plurality of channel shift switch control signals, and
   a plurality of inverters for outputting the plurality of channel shift switch enable signals by inverting a signal output from the plurality of NOR gates, respectively.

2. The integrated circuit as claimed in claim 1, further comprising:
   a plurality of even numbered test pad control switches connecting corresponding even numbered test pads among the plurality of test pads; and
   a plurality of odd numbered test pad control switches connecting corresponding odd numbered test pads among the plurality of test pads.

3. The integrated circuit as claimed in claim 1, wherein, when the short path enable signal is at a high level, the channel shift switch enable signal generation block generates the plurality of channel shift switch enable signals having a high level.

4. The integrated circuit as claimed in claim 1, further comprising:
a plurality of charge share switches respectively connected between each of the plurality of output pads and a power supply line; and
a plurality of output switches respectively connected to each of the plurality of output pads.

5. The integrated circuit as claimed in claim 4, wherein each of a plurality of charge share switches is in an off-state in response to a charge share switch enable signal to detect a short path between the plurality of output pads, wherein each of the plurality of output switches is in an off-state in response to an output switch enable signal.

6. A display driver, comprising:
a source driver including an integrated circuit configured to supply an image data to a display panel in response to a plurality of source driver control signals;
a gate driver configured to successively drive gate lines of the display panel in response to a plurality of gate driver control signals; and
a controller configured to generate the plurality of source driver control signals and the plurality of gate driver control signals, wherein the integrated circuit, includes:
a plurality of output pads,
a plurality of test pads,
a plurality of channel shift switches respectively connected between the plurality of output pads and the plurality of test pads and operated by a plurality of channel shift switch enable signals, and
a channel shift switch enable signal generation block configured to generate the plurality of channel shift switch enable signals according to a short path enable signal, wherein existence of a short path between the plurality of output pads is determined when each of the plurality of channel shift switch enable signals are simultaneously at a high level, and
wherein the channel shift switch enable signal generation block includes:
a plurality of NOR gates for performing a NOR operation on the short path enable signal and a corresponding one of a plurality of channel shift switch control signals, and
a plurality of inverters for outputting the plurality of channel shift switch enable signals by inverting a signal output from the plurality of NOR gates, respectively.

7. The display driver as claimed in claim 6, wherein the integrated circuit further comprises:
a plurality of even numbered test pad control switches connecting corresponding even numbered test pads among the plurality of test pads; and
a plurality of odd numbered test pad control switches connecting corresponding odd numbered test pads among the plurality of test pads.

8. The display driver as claimed in claim 6, wherein, when the short path enable signal is at a high level, the channel shift switch enable signal generation block generates the plurality of channel shift switch enable signals having a high level.

9. The display driver as claimed in claim 6, wherein even numbered test pads and odd numbered test pads among the plurality of test pads are provided with different voltages to detect a short path between the plurality of output pads.

10. A display device, comprising:
a display panel; and
the display driver as claimed in claim 6.

* * * * *